US006812724B2

(12) United States Patent
Rao et al.

(10) Patent No.: US 6,812,724 B2
(45) Date of Patent: Nov. 2, 2004

(54) METHOD AND SYSTEM FOR GRAPHICAL EVALUATION OF IDDQ MEASUREMENTS

(76) Inventors: Lan Rao, 25131 DPO Way, New Brunswick, NJ (US) 08901; Michael L. Bushnell, 16 Sherbrooke Dr., Princeton Junction, NJ (US) 08550

( * ) Notice: Subject to any disclaimer, the term of this patent is extended or adjusted under 35 U.S.C. 154(b) by 32 days.

(21) Appl. No.: 10/372,448

(22) Filed: Feb. 24, 2003

(65) Prior Publication Data

US 2003/0171896 A1 Sep. 11, 2003

Related U.S. Application Data

(60) Provisional application No. 60/358,366, filed on Feb. 22, 2002, provisional application No. 60/378,044, filed on May 16, 2002, and provisional application No. 60/378,067, filed on May 16, 2002.

(51) Int. Cl.[7] .......................... G01R 31/02; G01R 31/26
(52) U.S. Cl. ....................................... 324/763; 324/765
(58) Field of Search ................................. 324/537, 763, 324/765, 158.1; 438/14, 17–18; 257/40, 48; 714/718–719; 702/108–109

(56) References Cited

U.S. PATENT DOCUMENTS

| | | | |
|---|---|---|---|
| 5,682,395 A | 10/1997 | Begin et al. | 714/793 |
| 5,694,063 A | 12/1997 | Burlison et al. | 327/50 |
| 5,844,909 A | 12/1998 | Wakui | 371/5.1 |
| 5,869,977 A | 2/1999 | Kalb, Jr. et al. | 324/765 |
| 5,889,408 A | 3/1999 | Miller | 324/765 |
| 5,914,615 A | 6/1999 | Chess | 324/765 |

(List continued on next page.)

OTHER PUBLICATIONS

Gattiker, A., Nigh, P., Grosch, D., Maly, W., Current Signatures for Production Testing [CMOS ICs], IDDQ Testing, 1996, IEEE International Workshop, Oct. 1996, pp. 25–28.

C. Thibeault, A Novel Probablistic Approach for IC Diagnosis Based on Differential Quiescent Current Signatures, 15th IEEE VLSI TEst Symposium, Apr. 27–May 1, 1997.

Nigh, P et al., As Experimental Study Comparing the Relative Effectiveness of Functional, Scan, IDDq and Delay–fault Testing, IEEE VLSI Test Symp Apr.–May 1997, pp. 459–464.

Thibeault, C., A Novel Probablistic Approach for IC Diagnosis Based on Differential Quiescent Current Signatures, IEEE VLST Test Symp Apr.–May 1997, pp. 80–85.

Gattiker, A et al., Current Signatures for Production Testing [CMOS ICs], IDDQ Testing, 1996, IEEE International Workshop, Oct. 1996, pp. 25–28.

*Primary Examiner*—Kamand Cuneo
*Assistant Examiner*—Jermele Hollington
(74) *Attorney, Agent, or Firm*—Mathews, Collins, Shepherd & McKay, P.A.

(57) ABSTRACT

The present invention relates to a method and system for detecting defects within an integrated circuit in which one or more parameters of a classifier are determined by graphical evaluation of IDDQ current measurements. Parameters of the classifier can include a number of bands for a good integrated circuit, a width of a band for a good chip, a width ratio between any two bands for a good integrated circuit, a separation between bands for a good integrated circuit, a separation ratio between any two bands for a good integrated circuit, a maximum slope for a good band, a variation in a band width for a good band, a maximum IDDQ value for a chip, a minimum IDDQ value for a chip, a mean of a band of a chip, a standard deviation of a band of a chip, a lack of activity of IDDQ measurements conducted in the integrated circuit, noise in the IDDQ measurements conducted in the integrated circuit and glitches in the IDDQ measurements conducted in the integrated circuit. The parameters can be customized for the integrated circuit under test. The method and system can be used with all types of digital CMOS integrated circuits including integrated circuits with or without memories and deep submicron integrated circuits with or without memories.

44 Claims, 15 Drawing Sheets

U.S. PATENT DOCUMENTS

| | | | |
|---|---|---|---|
| 6,239,606 B1 | 5/2001 | Miller | 324/765 |
| 6,239,607 B1 | 5/2001 | Maxwell et al. | 324/765 |
| 6,246,248 B1 | 6/2001 | Yamagishi | 324/763 |
| 6,301,168 B1 | 10/2001 | Crocker | 365/201 |
| 6,459,293 B1 * | 10/2002 | Keshavarzi et al. | 324/763 |
| 6,489,800 B1 | 12/2002 | Dallavalle | 324/765 |
| 6,515,500 B1 * | 2/2003 | Okuda | 324/765 |
| 6,697,978 B1 * | 2/2004 | Bear et al. | 714/718 |
| 2002/0060584 A1 * | 5/2002 | Okuda | 324/765 |
| 2003/0016044 A1 * | 1/2003 | Ishida et al. | 324/765 |

* cited by examiner

METHOD AND SYSTEM FOR GRAPHICAL EVALUATION OF IDDQ MEASUREMENTS

This application claims priority of Provisional Application No. 60/358,366, filed Feb. 22, 2002, entitled "IDDQ Current Evaluation VLSI Testing Method"; Provisional Application No. 60/378,044, filed May 16, 2002, entitled "Graphical IDDQ Signatures Reduce Defect Level and Yield Less" and Provisional Application No. 60/378,067, filed May 16, 2002, entitled "Obtaining Highly Reliable VLSI Chips via Graphical IDDQ Current Evaluation," the contents of which are each incorporated by reference into this application.

BACKGROUND OF THE INVENTION

1. Field of the Invention

This invention relates generally to a method of detecting defects in an integrated circuit and in particular to a method and system for determining whether a defect exists within an integrated circuit by measuring and graphically evaluating IDDQ current conducted by the integrated circuit.

2. Description of the Related Art

Testing of a semiconductor device is performed to determine if it is a good device or if it contains defects. IDDQ testing has been used to detect faults within an integrated circuit. Quiescent current, commonly referred to as drain to drain quiescent current (IDDQ), is composed primarily of leakage current. Generally, IDDQ testing is a testing technique which discriminates the presence or absence of a fault by monitoring IDDQ because, if an IC suffers from a short-circuiting fault, a bridging fault or the like, then excessive IDDQ flows in a steady state, which proves the presence of a fault.

Conventional IDDQ testing methods include setting a threshold value of the IDDQ current, in which the integrated circuit being tested is failed if the IDDQ current conducted by the integrated circuit exceeds the threshold value. The IDDQ current is measured while inputs to the integrated circuit are driven high or low depending on predetermined states of input test vectors. IDDQ testing includes stepping through many different combinations of input test vectors to exercise the functionality within the integrated circuit.

One of the most difficult elements of IDDQ testing is setting the threshold value. An integrated circuit that draws more current than the threshold value of IDDQ for any input test vector is declared defective. An integrated circuit that draws less current than the threshold value of IDDQ is considered good. If the threshold value is set too high, then integrated circuits that contain defects may be considered good. This decreases the quality level of the integrated circuits considered good. If the threshold value is set too low, then integrated circuits that are free of defects may fail the IDDQ test. This increases the cost of the integrated circuits considered good. Therefore, the determination of the threshold value for IDDQ testing involves a trade-off between the quality and the cost of the integrated circuits which pass the IDDQ testing.

Gattiker and Maly (A. E. Gattiker and W. Maly, "Current Signatures", Proc. VLSI Test Symposium, pp. 112–117, 1996) proposed a method which eliminates some of the threshold selection problems. Traditionally, testing of an integrated circuit ends as soon as the integrated circuit fails the IDDQ test. Gattiker and Maly proposed that IDDQ values be measured for a complete set of input test vectors. A complete set of input test vectors include enough test vectors to completely exercise the functionality of the circuitry within the integrated circuit being tested. From the measured values of IDDQ, a current signature is generated. The current signature includes an ordering of the IDDQ measurements from the smallest value to the largest value. Gattiker and Maly claim that the magnitude of the measurements is not as important as the shape of a plot of the current signature. If there are no large jumps in the plot of the current signature, then the integrated circuit is designated as good. If the plot of the current signature include any significant jumps or discontinuities, then the integrated circuit is designated as defective. Testing methods using the Gattiker and Maly IDDQ current signature concepts require a complete set of input vector test settings to be applied to the integrated circuit under test and the resultant measured values of IDDQ current for each input vector test setting to be analyzed.

Methods have been described for reducing the input vector test set. Gattiker and Nigh (A. E. Gattiker, P. Nigh, D. Grosch, and W. Maly, "Current Signatures for Production Testing," Proc. of the IEEE International Workshop on IDDQ Testing, pp. 25–28, October 1996) describe taking a current measurement for the first vector and rejected die based on subsequent vectors producing currents that differed from the first value by some threshold. Thibeault (C. Thibeault, "A Novel Probabilistic Approach for IC Diagnosis Based on Differential Quiescent Current Signatures," Proc. of the $15^{th}$ VLSI Test Symp., pp. 80–85, April–May 1997) describe taking differences in IDDQ measurements between a vector and the next one to differentiate good and bad chips.

U.S. Pat. No. 5,914,615 describes a method of improving the quality and efficiency of IDDQ testing. The method includes calculating an upper threshold IDDQ value and a lower threshold IDDQ value. The input nodes are driven to a predetermined combination of input voltages and a corresponding IDDQ value is measured. It is determined whether the measured IDDQ value is between the upper threshold IDDQ value and the lower threshold IDDQ value. Alternatively, the upper and lower threshold values are determined as being dependent on a measured mean value of IDDQ for the integrated circuit.

Typical methods for IDDQ testing require a low background current while in the quiescent state. As device characteristics of semiconductors become smaller and more dense, the IDDQ current caused by defects becomes smaller and harder to differentiate from the increasing background leakage current. For example, in submicron devices large background currents in the range of approximately several tens of milliamps (MA) are likely due to short channel lengths.

U.S. Pat. No. 6,239,606 describes a method to perform IDDQ testing in the presence of high background leakage current. In the method, a first quiescent current measurement is taken. At least a portion of a semiconductor device is biased and a second quiescent current measurement is taken. The portion of the semiconductor device that was biased is then unbiased and a third quiescent current measurement is taken. The first, second and third quiescent currents are then compared to determine if a defect exists in that portion of the semiconductor device.

It is desirable to provide an improved method for reliable testing which may include high leakage current.

SUMMARY OF THE INVENTION

The present invention relates to a method and system for detecting defects within an integrated circuit in which one or more parameters of a classifier are determined by graphical evaluation of IDDQ current measurements. An entire set of IDDQ measurements for chip is plotted and referred to as the band diagram, because the current measurements cluster into bands. Parameters of the classifier can include a number of bands for a good integrated circuit, a width of a band for a good chip, a width ratio between a first band and a second band for a good integrated circuit, a separation between bands for a good integrated circuit, a separation ratio between a first pair of adjacent bands and a second pair of adjacent bands for a good integrated circuit, a slope of a band, a variation in a band width, a maximum IDDQ value for a chip, a minimum IDDQ value for a chip, a mean of a band of a chip, a standard deviation of a band of a chip, a lack of activity of IDDQ measurements conducted in the integrated circuit, noise in the IDDQ measurements conducted in the integrated circuit and glitches in the IDDQ measurements conducted in the integrated circuit. The parameters can be customized for the integrated circuit under test. The parameters are determined from graphical evaluation of IDDQ current measurements on an integrated circuit during chip characterization. The parameters can be determined by multi-variable optimization. Thereafter, the determined one or more parameters of the classifier are applied to the integrated circuit under test to detect if the integrated circuit under test is good or defective. The method and system can be used with all types of integrated circuits with or without memories including digital CMOS integrated circuits including integrated circuits with memories and deep submicron integrated circuits with or without memories.

The invention will be more fully described by reference to the following drawings.

DETAILED DESCRIPTION

Figure 1:
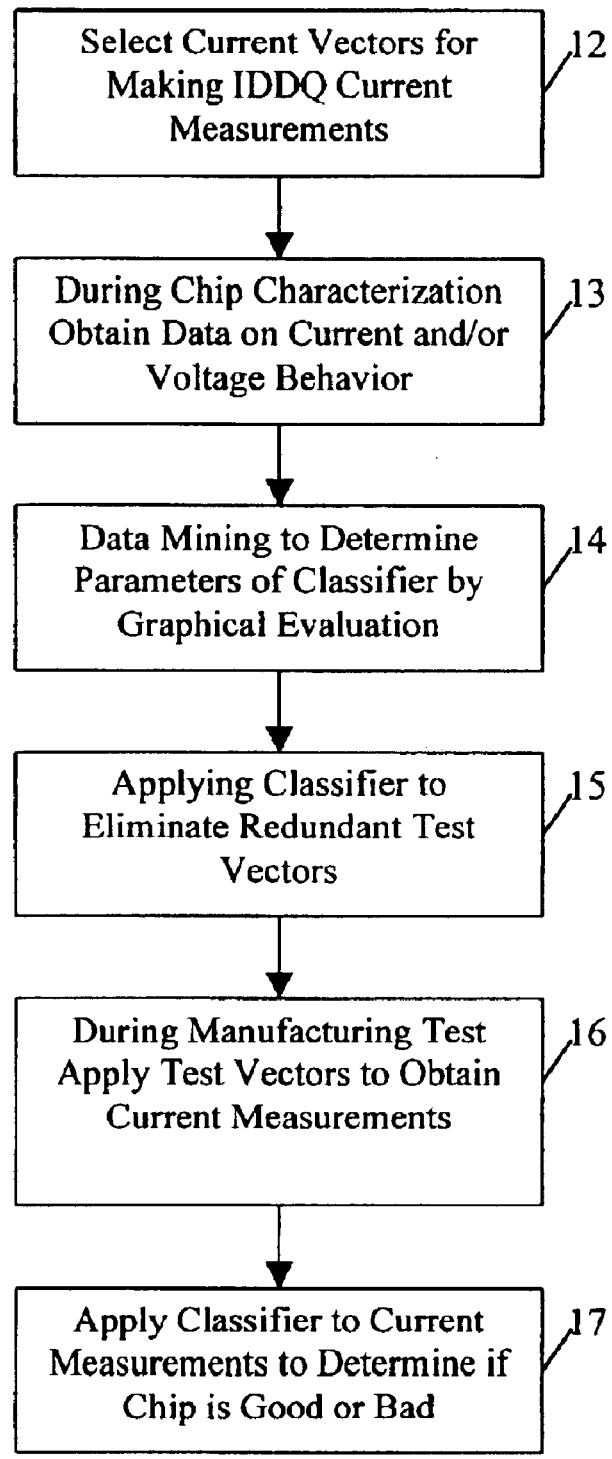
FIG. 1 is a flow diagram of a method for detecting defects within an integrated circuit in accordance with the teaching of the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

FIG. 1 is a flow diagram of a method for detecting defects within an integrated circuit 10 in accordance with the teachings of the present invention. In block 12, input current vectors are selected for making IDDQ measurements. Each measured value of IDDQ corresponds to a different combination of input current vectors. For example, the input current vectors can be generated by automatic test pattern generation tools or the input current vectors can be selected by an integrated circuit test engineer.

In block 13, during chip characterization, data is obtained on current and/or voltage behavior of the integrated circuit for a representative number of samples of integrated circuits. For example, the representative number of samples can be in the range of about 400 to about 1000. Data can be obtained by observing a representative number of samples using voltage test methods.

In block 14, data mining is performed to determine a classifier having one or more parameters which are applicable to the integrated circuit under test. Data mining includes graphical evaluation of the IDDQ current measurements versus the input current vectors to determine parameters of the classifier which are suitable for evaluating the circuit. The parameters of the classifier can be selected based on fabrication or design specifications of the integrated circuit.

Figure 2:
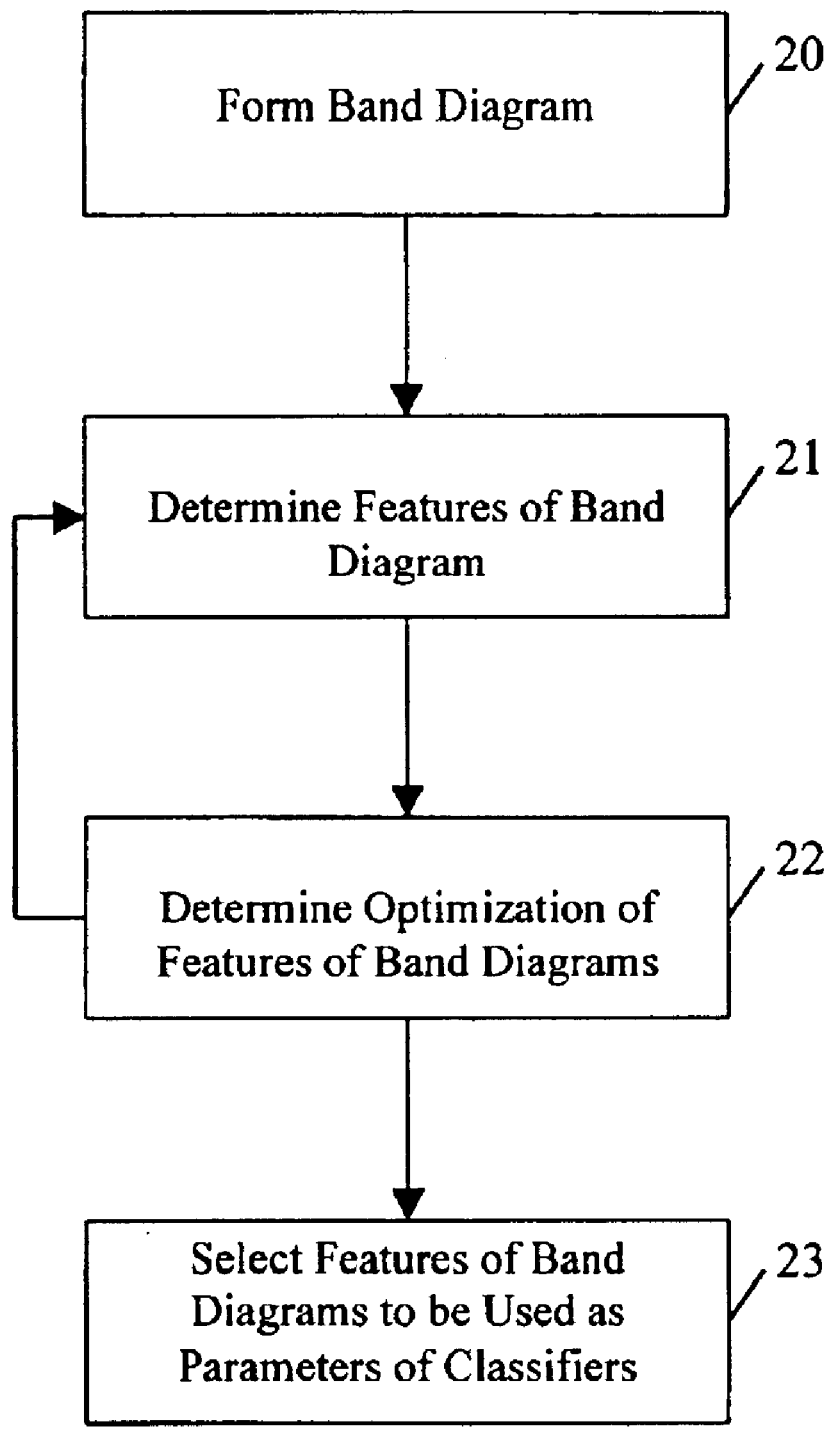
FIG. 2 is a flow diagram of a method for determining parameters of a classifier using graphical evaluation.

FIG. 2 illustrates an implementation of block 14 for a graphical evaluation of current measurements. In block 20, a band diagram is formed. In block 21, features of the band diagram are determined. A band diagram represents a graph of sorted IDDQ current measurements against an identified test vector. For example, the features of the band diagram can include the number of bands, the width of the bands, the mean of each band, the standard deviation of each band, the noise level of the IDDQ current measurements, the separation between bands, a variation in a band width, a slope of a band, the maximum IDDQ value, the minimum IDDQ value and lack of activity of IDDQ current measurements. Lack of activity in IDDQ measurements means that all IDDQ measurements are the same and the chip is stuck at a status that cannot be changed.

A band in the band diagram can be established in many ways. For example, a minimum variance algorithm can be used to determine the correct number of bands from the minimum sum of variances. The choice of the separation points of the bands can be determined by various methods. For example, a two-fold method can be used. In a first step, bands are roughly separated, such as by putting the separation points in several different positions, and in a second step, the minimum variance method is used to verify the partition. Alternatively, other pattern recognition techniques can be used to determine the number of bands in a band diagram, such as mean shift, Hough transform and the like. It will be appreciated to those of skill in the art that other methods can be used for determining a band in the band diagram. In one embodiment, a band is established by calculating the distance between adjacent points and comparing the distance to a criteria of noise ratio, which is a predetermined percentage of the maximum value of IDDQ for the chip. The criteria can be that if an IDDQ current measurement of a first band differs by more than the predetermined percentage of a maximum value of IDDQ of a second IDDQ current measurement, a new band occurs. The highest band begins at a highest IDDQ current measurement and a lower band ends at a lowest IDDQ current measurement. For example, the predetermined percentage can be 10% of the maximum value of IDDQ current. After it is determined that a first and second band exist, the width of the first band is determined. A separation between the first and second band can be determined as a distance between the first band and the second band. A mean value of each band can be determined. A standard deviation can be determined for values in the band from the mean.

Extreme points of the band diagram can be determined. Extreme points refer to points which are at the edge of a band. The noise level in the IDDQ current measurements can be determined by determining if one or more extreme points in a band are a certain number of the standard deviation times away from the mean of the band. For example, if the extreme points are greater than two times the standard deviation away from the mean of the band, a noise level in the IDDQ current measurements can be determined. The noise level can also be determined by comparing the band width of any two bands of IDDQ measurements. If the comparison of the band width is greater than a predetermined value, a noise value is determined. Because band widths in the IDDQ measurements of a chip should be substantially the same, a large difference between the bands signals the existence of noise. The method can be repeated for all sorted IDDQ current measurements to determine all adjacent bands and the total number of bands.

Another feature of a band diagram of a band width ratio can be determined as a ratio between a width of a first band and a width of a second band. Another feature of a band diagram of a band separation ratio can be determined as a ratio of a separation between a first pair of adjacent bands and a separation between a second pair of adjacent bands.

Another feature of a band diagram having a glitch can be determined from the IDDQ current measurements. A glitch can be determined by sorting the IDDQ current measurements and determining if the maximum IDDQ current measurement differs from an adjacent IDDQ current measurement by more than a predetermined number. For example, if the maximum IDDQ current measurement differs from an adjacent IDDQ current measurement by more than about 20 times a value of the minimum IDDQ current measurement a glitch is determined.

Block 21 is repeated for the representative number of samples of integrated circuits used during chip characterization. In block 22, features of the band diagram are analyzed to determine the optimal value for each of the features for a good integrated circuit, such as by multi-variable optimization techniques. In block 23, based on the optimization of the features of the band diagram, one or more features of the band diagram can be used to determine one or more parameters of the classifier. Parameters of the classifier can include a number of bands for a good integrated circuit, a width of a band for a good chip, a width ratio between a first band and a second band for a good integrated circuit, a separation between bands for a good integrated circuit, a separation ratio between a first pair of adjacent bands and a second pair of adjacent bands for a good integrated circuit, a slope of a band, a variation in a band width, a maximum IDDQ value for a good chip, a minimum IDDQ value for a chip, a lack of activity of IDDQ measurements conducted in the integrated circuit, noise in the IDDQ measurements conducted in the integrated circuit and a glitch in the IDDQ measurements conducted in the integrated circuit. For example, if the optimization indicates that the optimal value of the number of bands for a good chip is a number, such as 4, and the optimal value for the separation between bands is a value, such as less than 5 $\mu A$, the features of a number of bands and band separation can be selected to be used as parameters of the classifier.

Referring to FIG. 1, after the one or more parameters of the classifier are established, the classifier is used to eliminate redundant test vectors, in block 15. A combination of input current test vectors are selected to provide a fewest number of input test current vectors that can be used with the parameters selected for the classifier, thereby eliminating redundant test vectors. For example, the combination of input current test vectors to provide a fewest number of input current test vectors can be selected by randomly choosing a certain number of input current test vectors, choosing a subset of input current test vectors by using a starting point and a certain number of vectors applicable to the selected parameters of the classifier or choosing a certain number of input voltage test vectors among different defect models, such as a bridging fault model, a pseudo stuck-at fault model and the like.

Figure 3:
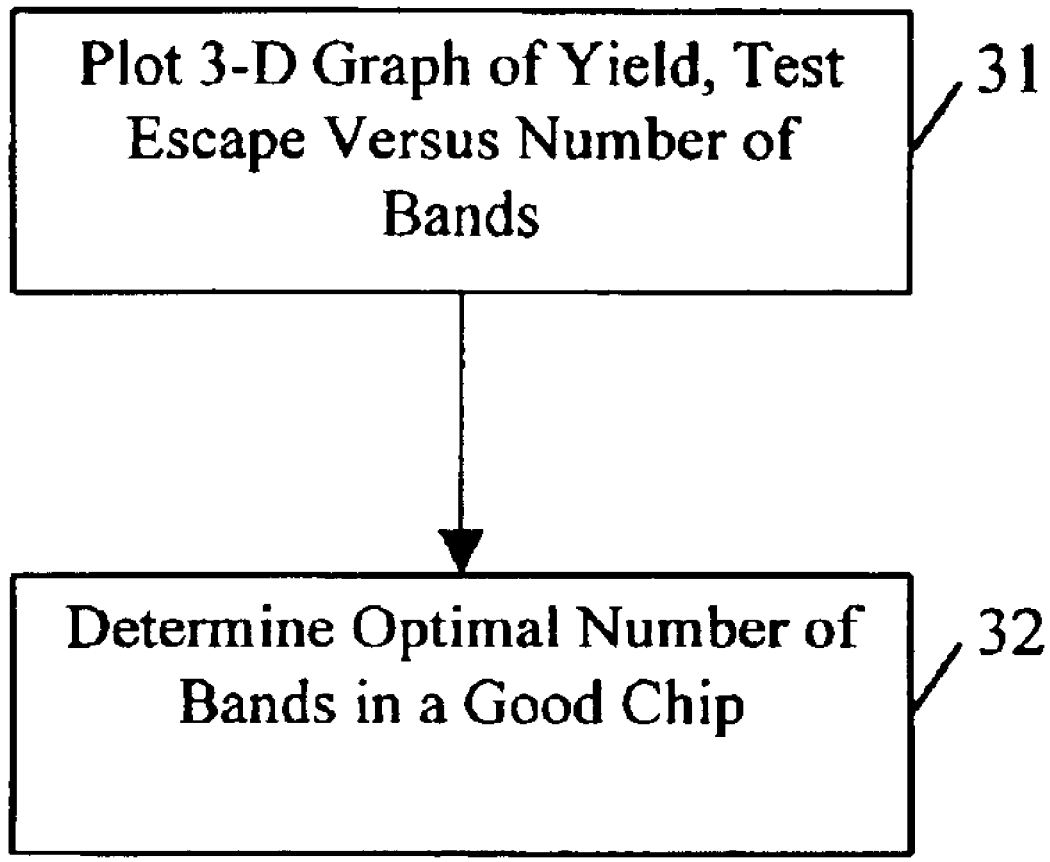
FIG. 3 is a flow diagram of an implementation of a method for determining optimization of the feature of the number of bands.

During manufacturing test, the determined set of input test current vectors from block 15 are applied to the integrated circuit and current measurements are determined in block 16. In block 17, the parameters of the classifier determined in block 14 are applied to the determined current measurements in order to determine if the integrated circuit is a reliable functional device, which is labeled "good," or an unreliable functional device in which a defect exists, which is labeled "bad." For example, each of the features of the classifier can be applied sequentially or in any order to current measurements and if any of the features fails a bad integrated circuit is determined. For example, the feature of the number of bands can be used as a first parameter of the classifier, the feature of the maximum value of IDDQ current measurement can be used as a second parameter of the classifier, the feature of band separation can be used as a third parameter of the classifier and the feature of band width can be used as a fourth parameter of the classifier. Method 10 can be used with all types of integrated circuits including CMOS integrated circuits and deep submicron integrated circuits FIG. 3 is a flow diagram of an implementation of block 22 of a method for determining optimization of the feature of the number of bands that all of the IDDQ current measurements cluster into for a good integrated circuit. In block 31, a three-dimensional graph can be determined by plotting yield, representing the number of good chips that are classified as good chips, and test escapes, representing the number of bad chips that are classified as good chips, versus the number of bands. The optimization of the three-dimensional graph is performed in block 32 to provide the optimal band number which has the optimal highest yield and the optimal lowest test escape.

Figure 4:
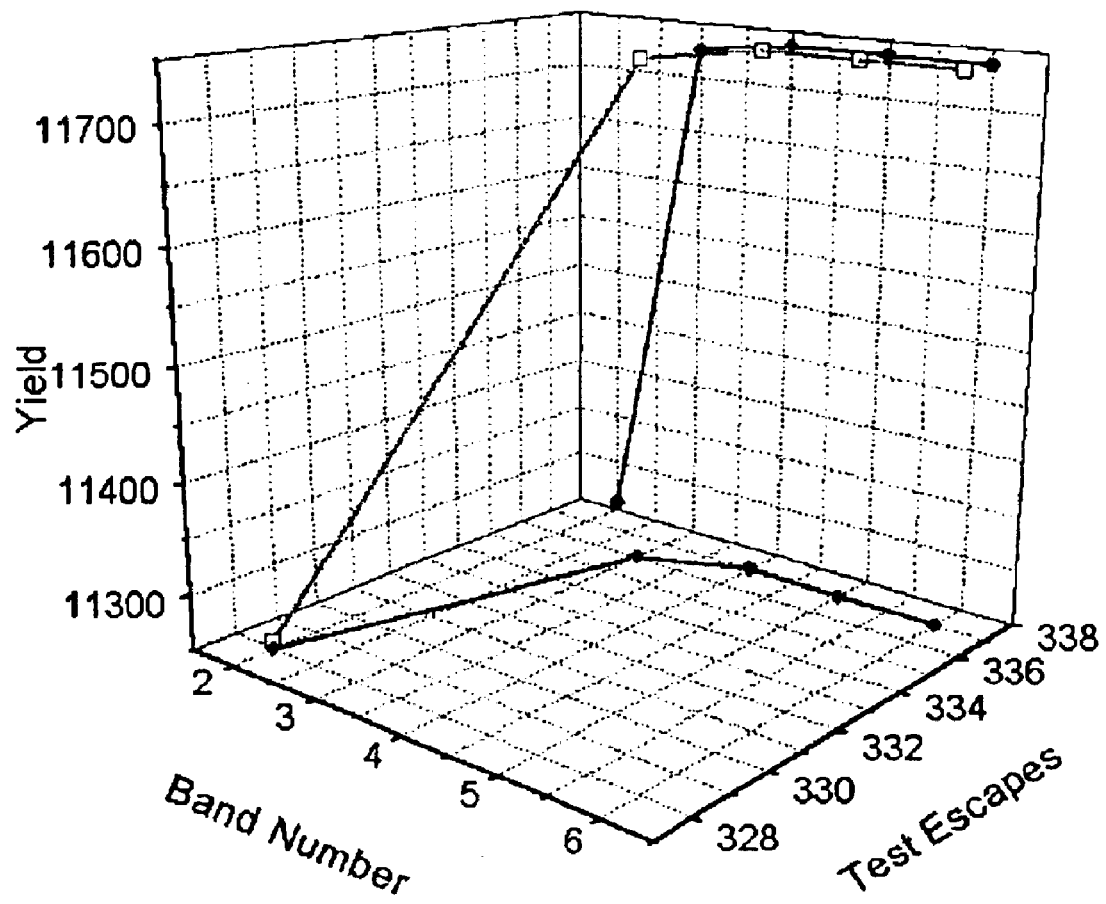
FIG. 4 is a three-dimensional plot of yield, test escape and the number of bands.

FIG. 4 is an example of a three-dimensional graph for plotting yield, test escape and number of bands of SEMATECH data. SEMATECH data is described in Nigh, P. et al. "An Experimental Study comparing the Relative Effectiveness of Functional, Scan, $I_{DDQ}$, and Delay-Fault Testing," In Proc. 26$^{th}$ IEEE VLSI Test Symp., Apr.–May 1997, pp. 459–464. It is observed that when the band number is four, the highest yield of 11,737 is obtained with a test escape of 337 which is slightly higher than the optimal value of test escape of 336.

Figure 5:
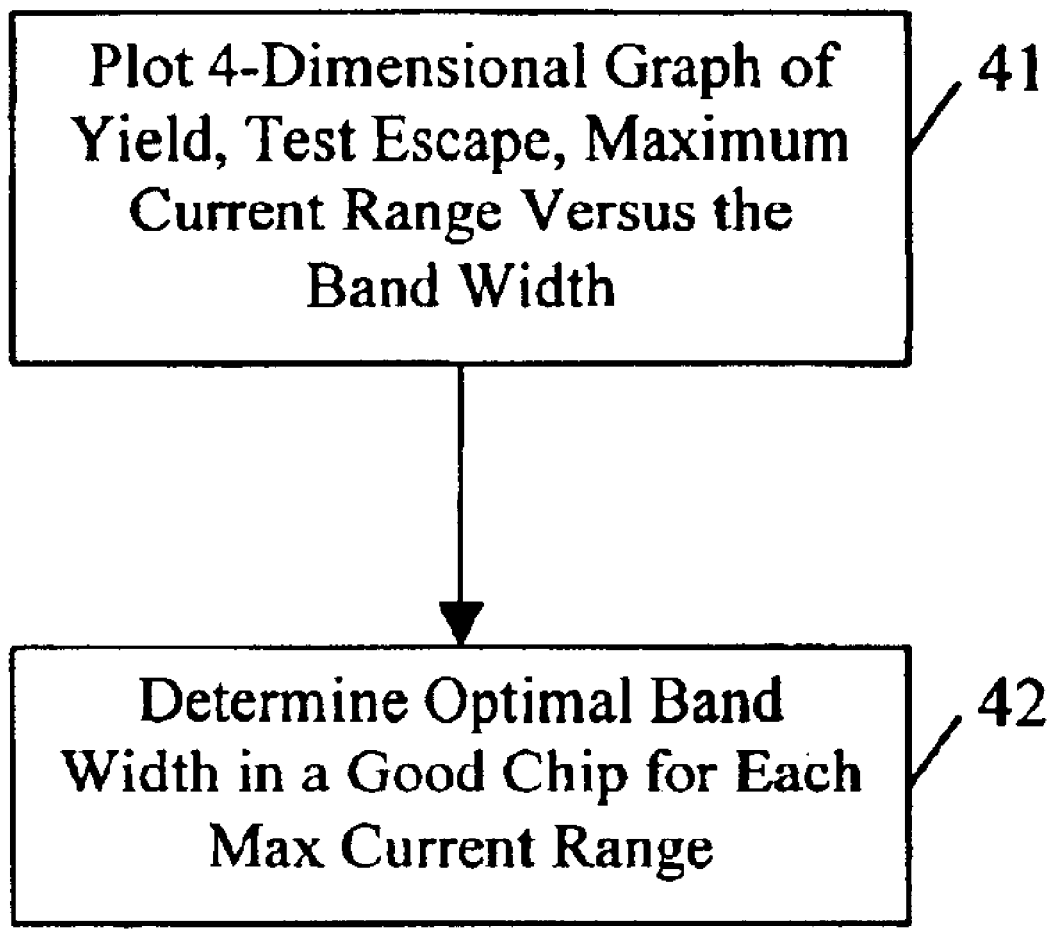
FIG. 5 is a flow diagram of an implementation of a method for determining optimization of the feature of the width of the bands.

FIG. 5 is a flow diagram of an implementation of a method for determining optimization of the features of the width of the bands. In block 41, a four-dimensional parameter optimization is determined by plotting yield, test escape, and maximum IDDQ current measurement range versus width of the bands. The optimization of the four-dimensional graph is performed in block 42 to determine the optimal width for each maximum IDDQ current measurement range which has the highest yield and the lowest test escape.

Figure 6:
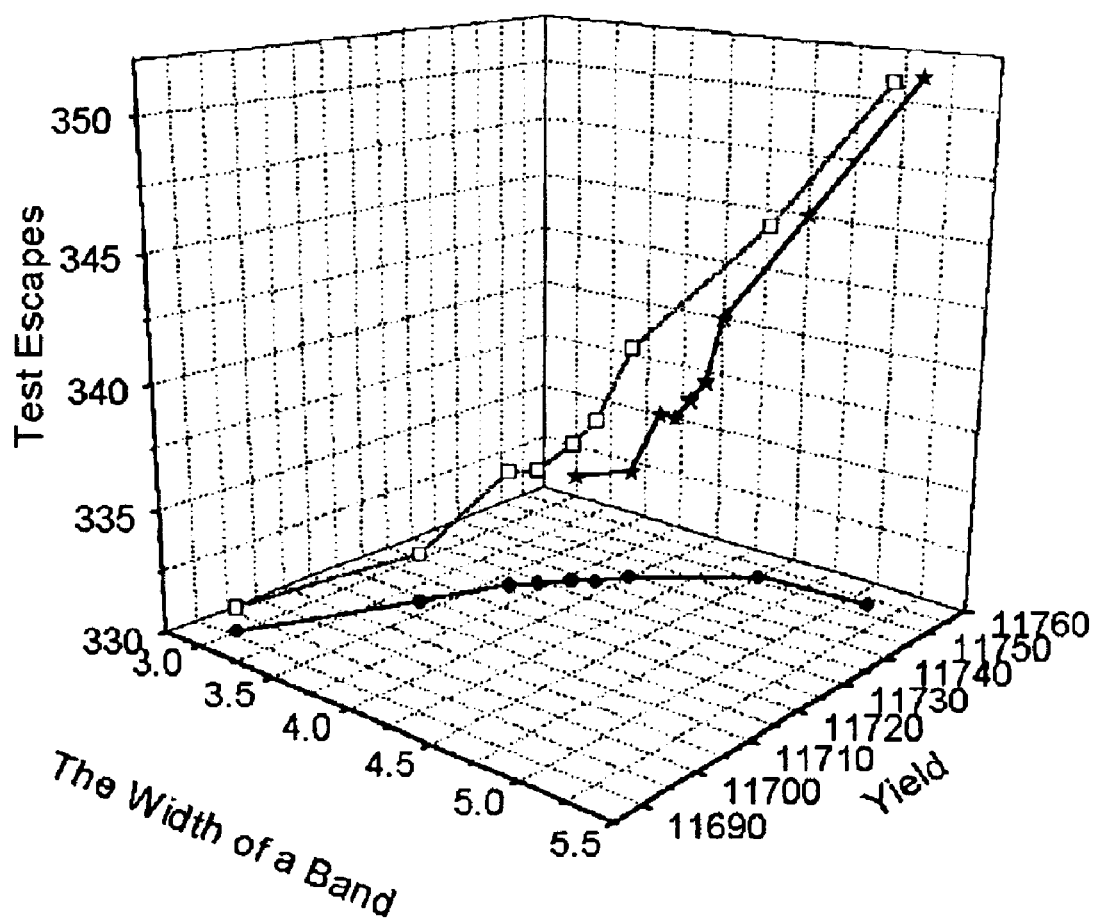
FIG. 6 is a three-dimensional plot of yield, test escape and the width of the bands.

FIG. 6 is an example of a three-dimensional graph for plotting yield, test range and band width of SEMATECH data. It is observed that with SEMATECH data the maximum IDDQ current measurement range did not substantially effect band width. Accordingly, a three-dimensional analysis was used. It is observed that when the width of the band is 3.9 $\mu$A it has the lowest test escape of 337, which is lower than when the width is 4.0 $\mu$A and the highest yield of 11737, which is higher than when the width is 3.8 $\mu$A.

Figure 7:
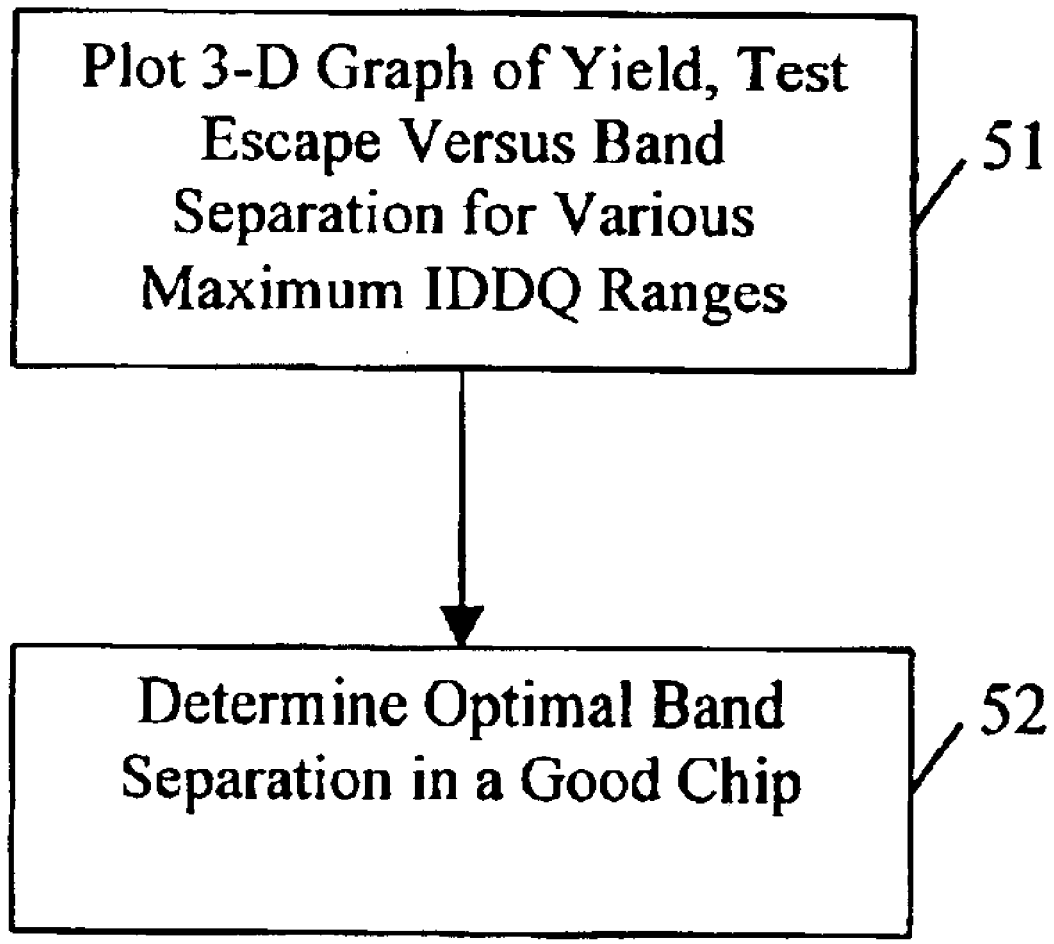
FIG. 7 is a flow diagram of an implementation of a method for determining optimization of the feature of the band separation.

FIG. 7 is a flow diagram of an implementation of a method for determining optimization of the feature of separation between bands. In block 51, a three-dimensional graph is determined by plotting yield, test escape and band separation. The optimization of the three-dimensional graph is performed in block 51 to determine the optimal band separation which has the highest yield and the lowest test escape.

Figure 8:
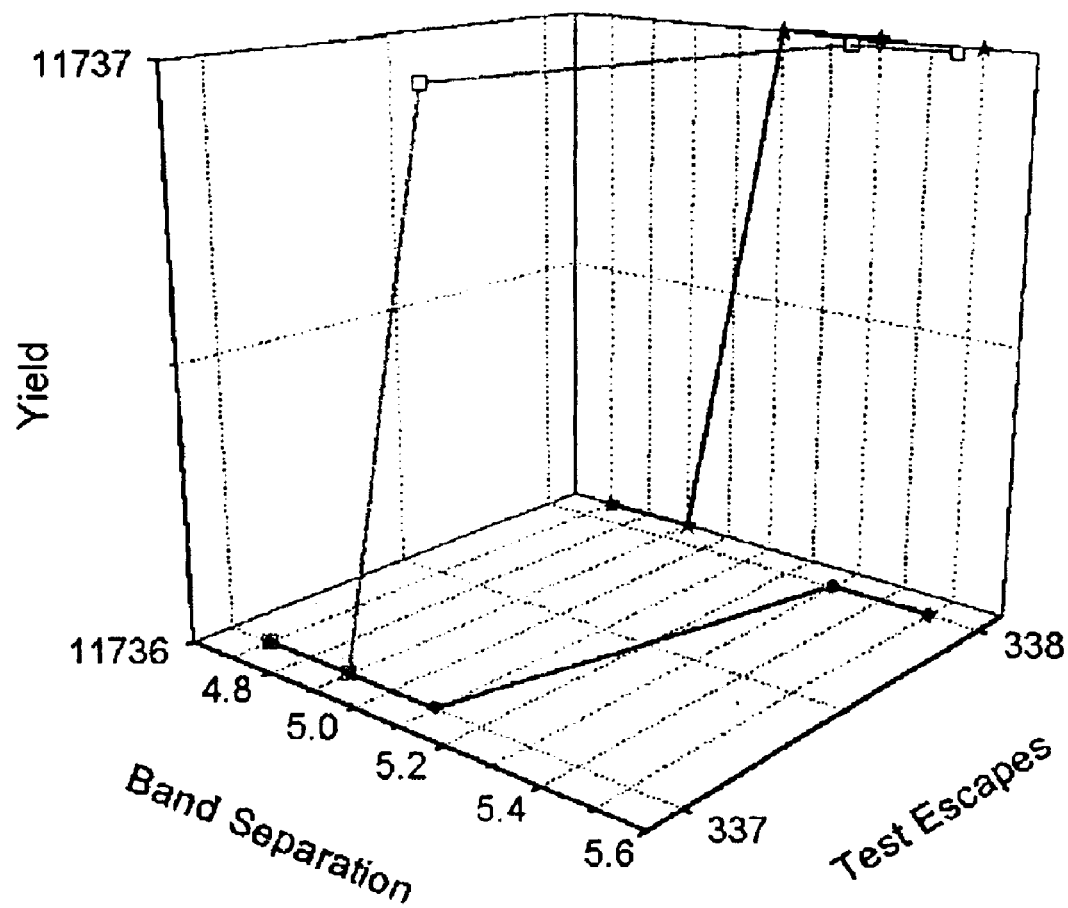
FIG. 8 is a three-dimensional plot of yield, test escape and band separation.

FIG. 8 is an example of a three-dimensional graph for plotting yield, test escape and band separation of SEMATECH data. It is observed that when the band separation is 5.1 $\mu$A it has the highest yield of 11,737 and the lowest test escape of 337.

The ratio of two different band widths and the ratio of two different band separations are other criteria for classification that can be obtained in a similar way.

The method for detecting defects within an integrated circuit 10 can be used to test any type of integrated circuit. For example, method 10 can be used to test CMOS devices and deep submicron (DSM) devices. DSM chips have been found to have IDDQ band patterns which can be tested by selecting the parameters of the classifier, as described above.

Figure 9:
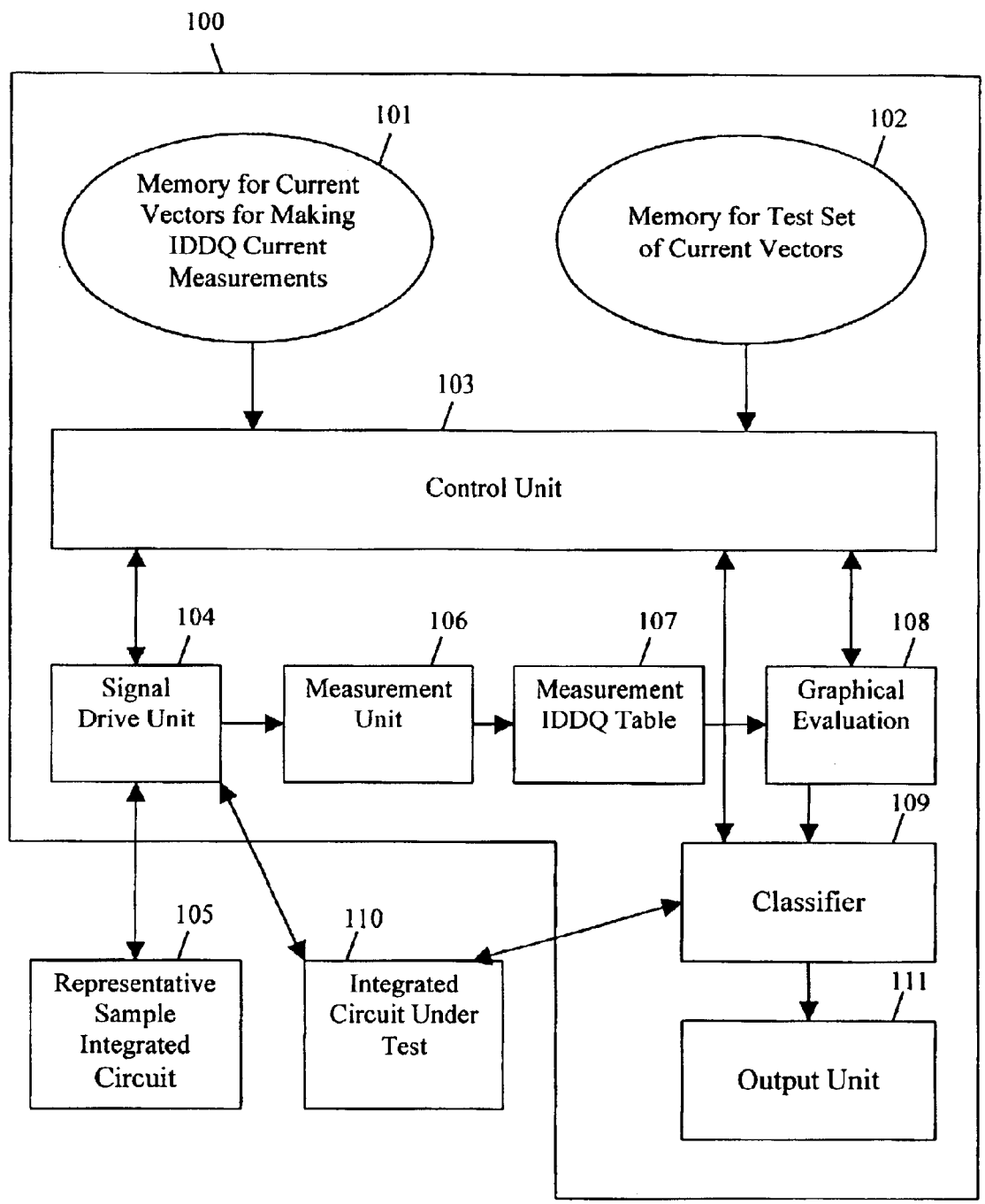
FIG. 9 is a schematic block diagram of a test device for the method for detecting defects within an integrated circuit in accordance with the teachings of the present invention.

FIG. 9 is a schematic diagram of a system for detecting defects within an integrated circuit 110 in accordance with the teachings of the present invention. Memory 101 stores information on current vectors for making IDDQ current measurements. Memory 102 stores information on test current vectors which are obtained by application of the classifier to eliminate redundant test vectors. Control unit 103 is a controller for controlling the entire testing device 100. Control unit 103 supplies information on current vectors for making IDDQ current measurements from memory 101 to signal drive unit 104. Signal drive unit 104 applies a test signal of a predetermined test pattern of the current test vectors to a representative number of sample integrated circuits 105. Measurement unit 106 measures IDDQ current of the integrated circuit 105, and converts the values into the measured IDDQ table, supplies it and stores it in the measured IDDQ table memory 107.

Control unit 103 activates graphical evaluation circuit 108. Graphical evaluation unit 108 determines features of IDDQ measurements stored in IDDQ table memory 107. Graphical evaluation unit 108 selects one or more features to be used as one or more parameters in classifier 109. Classifier 109 is applied to current vectors of memory 101 for determining test current vectors having fewest number of test vectors which can be used by classifier 109 and eliminating redundant test vectors. Test current vectors are stored in memory 102.

During testing, control unit 103 is supplied with test current vectors from memory 102. Signal drive unit 104 applies a test signal of a predetermined test pattern of the current vectors to integrated circuit under test 110. Measurement unit 106 measures IDDQ current of integrated circuit 110, and converts the values into the measured IDDQ table, supplies it and stores it in the measured IDDQ table memory 107. Classifier 109 is activated by control unit 103 for applying features to the determined IDDQ current measurements to determine if integrated circuit under test 110 is a reliable functional device which is labeled as good or an unreliable functional device which is labeled as bad. Outputs of classifier 109 such as measurement results, judgment results and calculation results are provided to output unit 111. Output unit 111 has a display, printer, output device and displays on a display screen or prints on a print medium the measurement results, judgment results, calculation results and the like. Output unit 111 can be constituted by a computer display and control unit 103, measurement IDDQ table memory 107, graphical evaluation unit 108 and classifier 109 can be constituted by a computer or microcomputer or automatic test equipment or built-in self-test scheme. Memory 101 and memory 102 are constituted by memories which can be read at a high speed.

Results

Sample IDDQ profiles for several chips are shown in FIGS. 10 through 21. Each IDDQ current measurement versus test vector number is plotted for all 195 vectors of SEMATECH IDDQ tests on the current-vector axes. The IDDQ test vectors consist of:

1. 125 vectors created by IBM's IDDQ test generator, which targets pseudo-stuck-at-faults (95.7% fault coverage of logic gate stuck-at faults and internal shorts);
2. 10 vectors that applied simple, regular patterns into the scan chains; and
3. The first 60 vectors of the stuck-fault tests.

Figure 15:
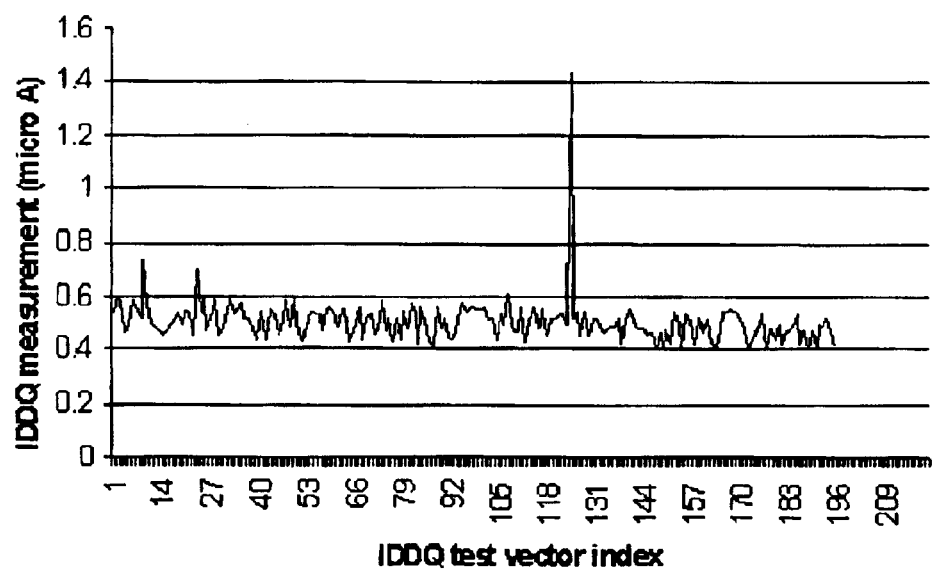
FIG. 15 is a band diagram of a faulty chip with a single-band IDDQ ($\mu$A) profile having a spiked noise.
Figure 16:
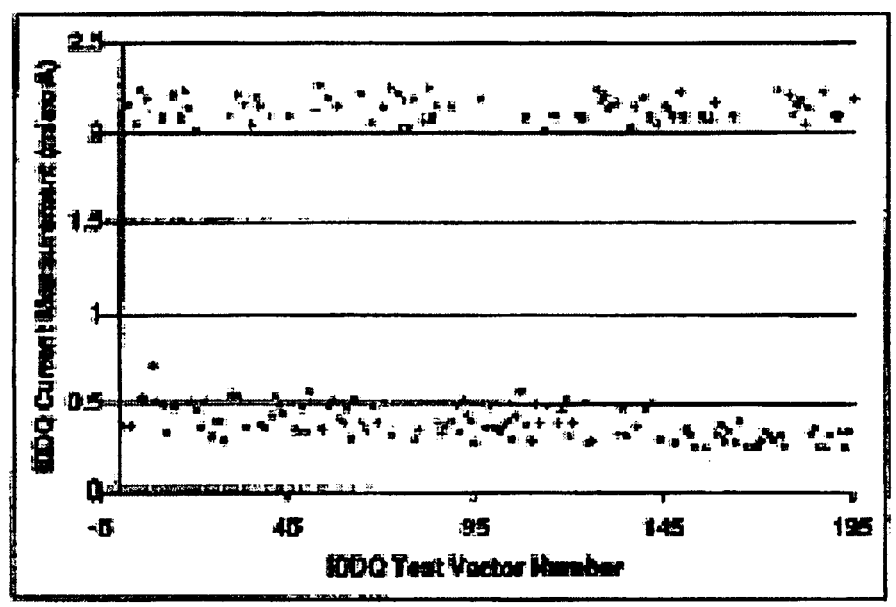
FIG. 16 is a band diagram of a good chip with IDDQ ($\mu$A) profile displaying two bands.

There were 5,674 good devices out of 18,466 devices that have the form of FIG. 16. FIG. 15 represents a bad device. It is observed that any comparison of the means or variances of conventional methods will fail the chip in FIG. 16 when the band separation is wide enough so that it exceeds the 3$\sigma$ threshold, and it will pass the chip in FIG. 15, because the spike does not exceed the 3$\sigma$ threshold. It is noted that a represents standard deviation. Another 5,684 devices have a band diagram as in FIG. 10, i.e. only one band.

Figure 10:
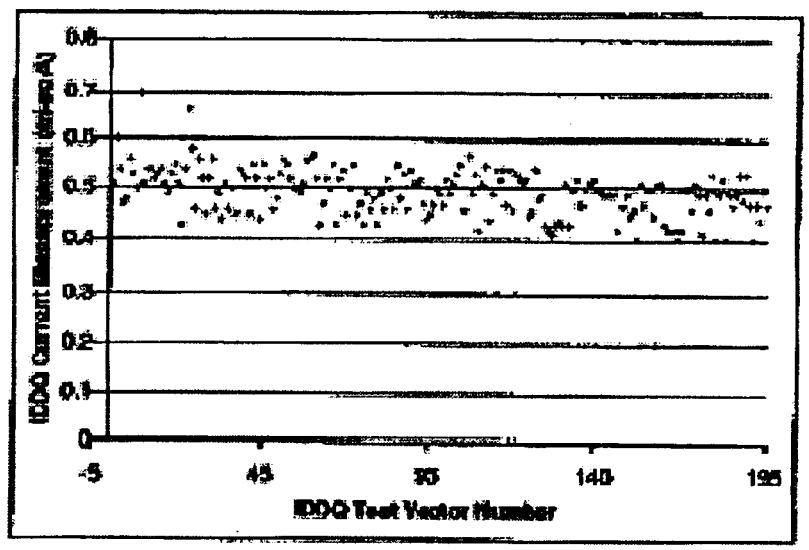
FIG. 10 is a band diagram of a good chip with a single-band IDDQ (muA) profile.
Figure 11:
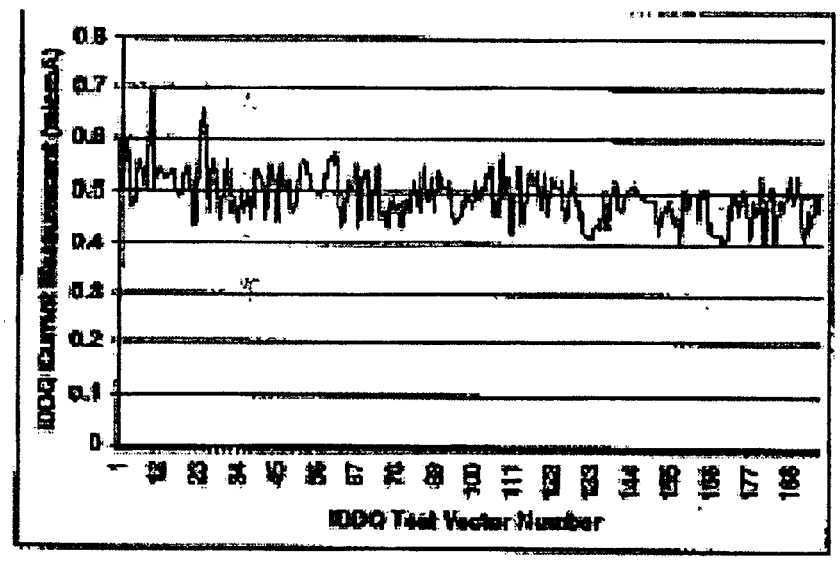
FIG. 11 is an alternative IDDQ ($\mu$A) plot for the good chip of FIG. 10.
Figure 17:
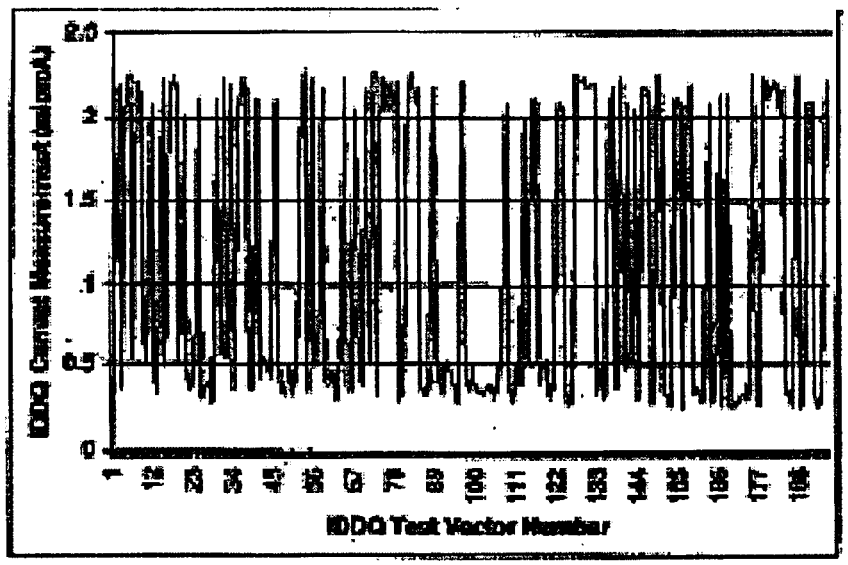
FIG. 17 is an alternative IDDQ ($\mu$A) plot for the good chip of FIG. 16.
Figure 18:
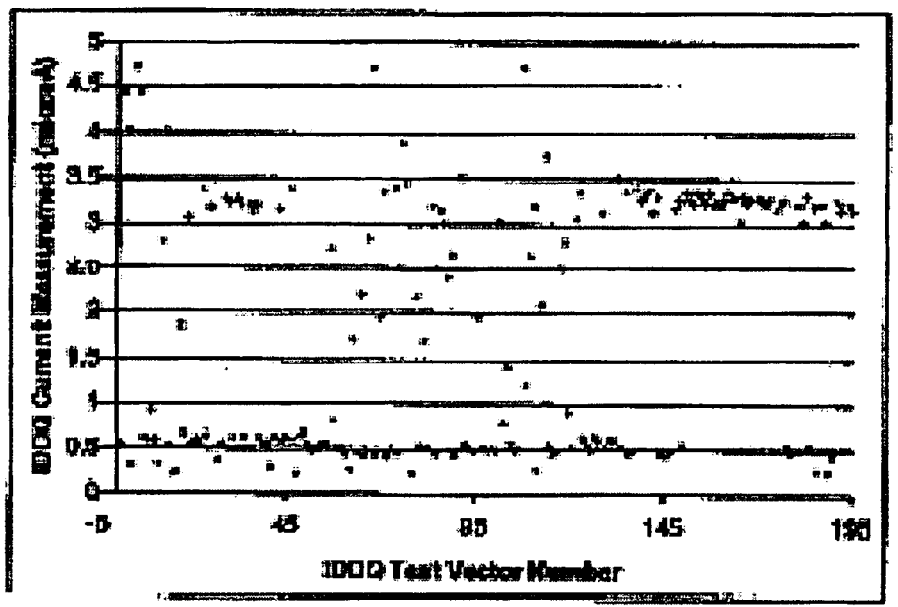
FIG. 18 is an IDDQ ($\mu$A) plot for a faulty chip with a smeared two-band profile.
Figure 19:
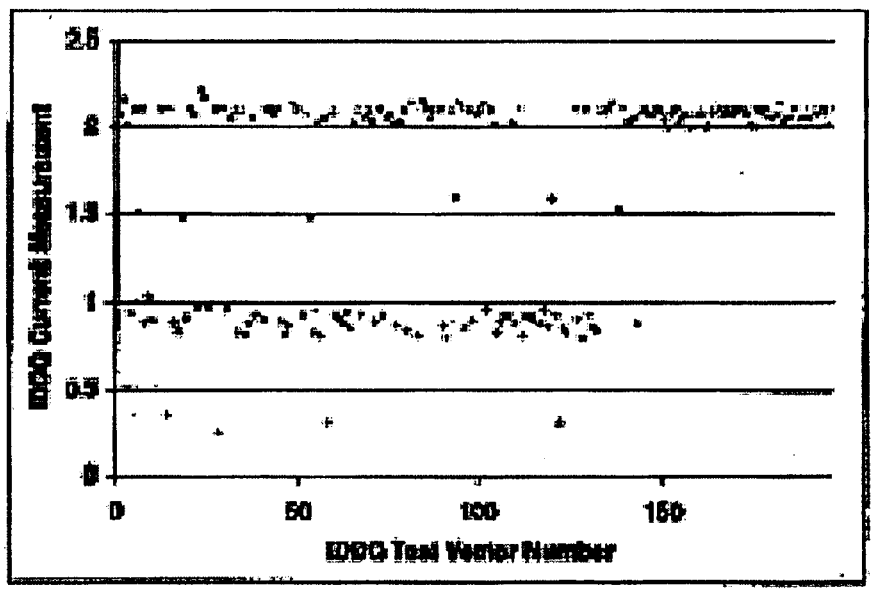
FIG. 19 is a faulty chip with a smeared (noisy) two-band IDDQ ($\mu$A) profile.

The IDDQ profiles are plotted in two ways, by points or by a line. FIGS. 10 and 11 show the profiles for the same device. This device and another one depicted in FIG. 12 have single-band profiles and represent good devices. Faulty devices shown in FIGS. 13 through 15 also have single-band profiles, which only differ from those of good devices due to either continuous or spiked noise. The two-band IDDQ profiles for a good device are shown in FIGS. 16 and 17. Two faulty two-band devices are depicted in FIGS. 18 through 21. The differentiation can be made by the presence of noise in the band structure.

Figures 12, 13:
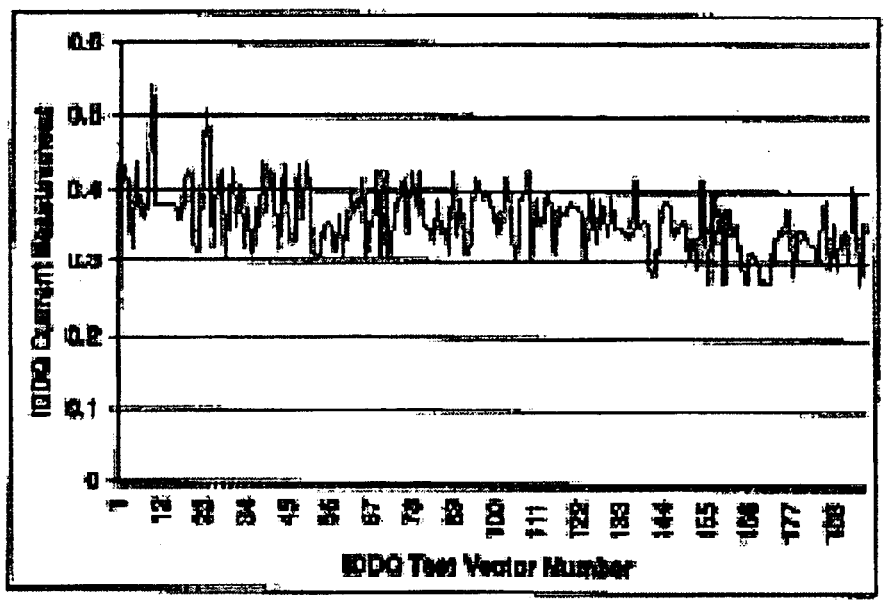
FIG. 12 is an IDDQ ($\mu$A) plot for another good chip with a single-band profile.
FIG. 13 is a band diagram of a faulty chip with a smeared (noisy) single-band IDDQ ($\mu$A) profile.

It was found that good devices had IDDQ measurements that clustered into well-defined bands as in FIG. 16 which can be identified by method 10 of the present invention since the bands of FIG. 16 satisfy the feature of the number of bands of a good integrated circuit having an optimal value of 4 or less for SEMATECH data. A possible physical explanation is that these devices have one or more resistive shorts of high resistance. Some vectors sensitize these shorts to current flow, by causing opposite potentials across the resistive short. Accordingly, good chips have multiple band current signatures, since a few benign, high resistance shorts can be present. It was found that bad devices had a width of a band greater than 3.9 $\mu$A for SEMATECH data, as shown in FIG. 13.

Statistics were plotted in Table 1 for all of the SEMATECH data, based on the classification standard of SEMATECH. SEMATECH data is described in Nigh, P. et al., in which five test steps were taken, i.e., wafer level, T0 package level, T1 packaged burn-in level (6 hours), T72 packaged burn-in level (72 hours) and T144 packaged burn-in level (144 hours). In each step, four kinds of tests were applied to each device: Stuck-at tests (8,023 patterns with 99.79% stuck-fault coverage); functional tests (532K cycles with 52% fault coverage); delay tests (15,232 patterns with 91% transition fault coverage); and SEMATECH IDDQ tests (195 patterns with >96% fault coverage). In total, 18,466 devices were tested at the wafer level. A subset of them went through the other four test steps. Some additional characterization tests were also added to package-level tests. Test results were recorded for each test step and the kinds of tests failed were also marked.

TABLE 1

The number of bands statistics in SEMATECH data.

| # Bands | Good Devices | Bad Devices | Unknown Devices |
|---|---|---|---|
| 1 | 5684 | 1592 | 351 |
| 2 | 5674 | 2429 | 546 |
| 3 | 487 | 1144 | 104 |
| 4 | 12 | 367 | 31 |
| >4 | 1 | 44 | 0 |

If the IDDQ pass/fail current threshold is set to 450 $\mu$A, it was observed from the SEMATECH test results and failure analysis data that:

1. If the device band diagram looks like FIG. 18, which has unclear bands, then even if the number of bands is more than 4, the device is bad with more than 99% certainty. A possible explanation is that the various resistive shorts in these devices have lower resistance. It is known that IDDQ defects also frequently show up as various path delay faults in the circuit, due to late transistor switching. The bands become unclear because different vectors sensitize different delay fault propagation paths, which lead to various different logic gates switching late in the clock period, and the bands smear and merge with each other.

2. If the band width is greater than 4 $\mu$A, then with more than 96% probability, the device is defective. The delay faults over varying propagation paths cause different numbers of late switching transistors, which effectively widens the band of current measurements.

3. If the bands, such as in FIG. 16, part more than 5 $\mu$A, then it is more than 98% probable that the device is defective. This means that the shorts had lower resistance, so the difference in the current measurement between a vector that sensitizes a resistive short and one that does not increases. It is observed that FIG. 16 is a good chip.

4. If several points are far apart from the majority band, say 20 times the minimum current, as in FIG. 15, then the device is most likely defective. The same physical explanation can apply for the chips with widely-separated bands.

5. If the number of bands is greater than 4, as in FIG. 19, then the device is most likely defective. In this case, there are more than just two resistive shorts in the chip, so more bands appear, indicating a systematic problem with resistive shorts in this particular chip, and therefore a defective device.

Figure 14:
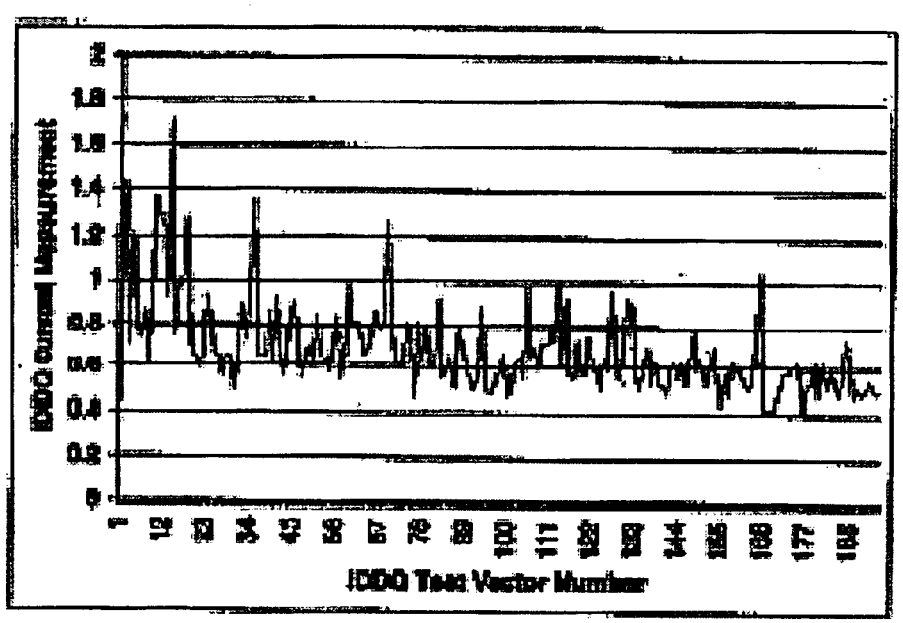
FIG. 14 is an alternate IDDQ ($\mu$A) plot for the faulty chip of FIG. 13.
Figure 20:
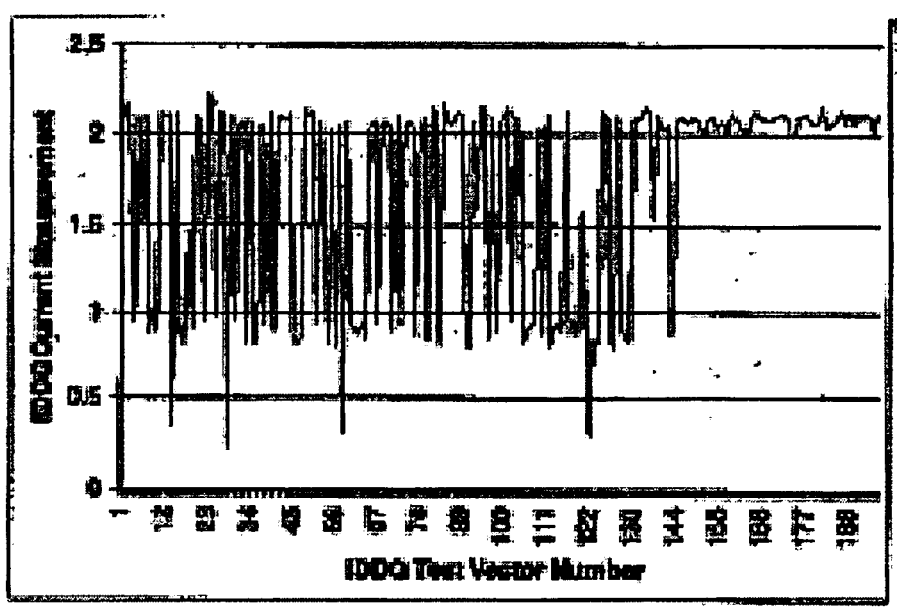
FIG. 20 is an alternative IDDQ ($\mu$A) plot for the faulty chip of FIG. 19.
Figure 21:
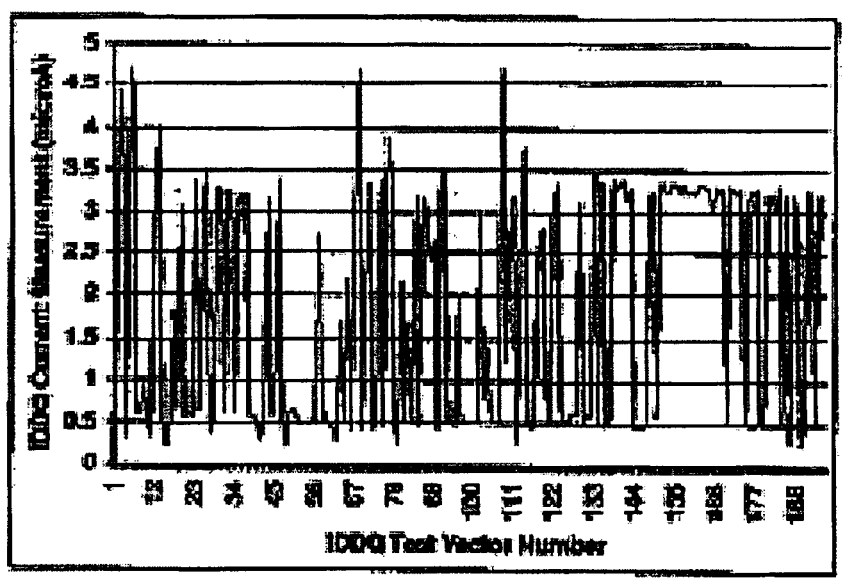
FIG. 21 is an alternative IDDQ ($\mu$A) plot for the faulty chip of FIG. 18.

The current points can be connected into one line. FIG. 11 is typical of the majority of defect-free devices, i.e., a high frequency random waveform. FIGS. 14, 15 and 20 are typical of the majority of defective devices. In FIG. 15, obvious glitches are observed. In FIGS. 14 and 20, the waveform has high frequency random signals. It differs from the defect-free ones, as the amplitude changes obviously in some places. The irregular glitches can either be featured by the different bands, or by observing glitches themselves. The changes in amplitude can be described by the number of bands, see FIG. 19, which is the band diagram of FIG. 20, or the unclear band, see FIG. 13, which is the band diagram of FIG. 14.

Results from the application of a classifier of the present invention using parameters of the classifier of the number of bands optimized in FIG. 4, the band width optimized in FIG. 6 and, band separation optimized 8 and glitch detection are shown in Table 2.

Based on these criteria and the voltage test results, the devices-under-test (DUTs) are classified into 6 categories in Tables 2 and 3. They are described as follows:

1. Good pass: Those DUTs that passed all SEMATECH tests and also passed the evaluation of method 10.
2. Good fail: Those DUTs that passed all SEMATECH tests but failed the evaluation of method 10.
3. Bad pass: Those DUTs that failed some SEMATECH tests other than the IDDQ test but passed the evaluation of method 10.
4. Bad fail: Those DUTs that failed some SEMATECH tests other than the IDDQ tests but also failed the evaluation of method 10.
5. Unknown pass: Those DUTs that only failed the SEMATECH IDDQ test but passed the evaluation of method 10.
6. Unknown fail: Those DUTs that only failed the SEMATECH IDDQ test and failed the evaluation of method 10.

TABLE 2

SEMATECH device statistics.

| | |
|---|---|
| Total reliable functional devices | 11858 |
| Total # of unreliable devices | 5576 |
| Unknown devices | 1032 |
| Good pass number | 11719 |
| Bad pass number | 333 |
| Unknown pass number | 153 |
| Good fail number | 139 |
| Bad fail number | 5243 |
| Unknown fail number | 879 |

TABLE 3

Summary of test escape and yield loss.

| Good Pass | Good Fail | Bad Pass |
|---|---|---|
| 0.9883 | 0.0117 | 0.0597 |
| Bad Fail | Unknown Pass | Unknown Fail |
| 0.9403 | 0.1483 | 0.8517 |

Table 4 provides the distribution of the types of DUTs that escaped the graphical IDDQ test. It was observed that there were 434 chips that failed at the SEMATECH wafer-sort stage but afterwards passed all tests. The results show that method 10 of the present invention would not have failed the 434 good devices. Bad chips were visually re-checked by observing a band diagram of the chip. It was found that another 105 chips can be visually classified as bad using the parameters of the classifier even though the parameters of the classifier classified them as good. By visual observation, we found that some bands are irregular even though they do not exceed the band width or band separation limits. By irregular, we mean that the band is not flat, or the band width changes along the band. This additional classification can reduce the Test Escape percentage of the graphical test algorithm to 3.9%.

TABLE 4

Devices escaping the graphical IDDQ test.

| Kind of failing voltage tests | Count/Total of kind |
|---|---|
| Stuck-at Failure Only | 10/10 |
| Delay Fault Failure Only | 83/85 |
| Functional Fault Failure Only | 18/19 |
| Fail functional test and delay test only | 9/10 |
| Fail stuck-at test and delay test only | 49/53 |
| Fail stuck-at test and IDDQ test only | 0/48 |
| Fail functional test and IDDQ test only | 6/72 |
| Fail functional test and stuck-at test only | 48/49 |
| Fail IDDQ test and delay test only | 5/85 |
| Other 3 failed but not functional test | 3/1234 |
| Other 3 failed but not delay test | 0/159 |
| Other 3 failed but not IDDQ test | 53/58 |
| Other 3 failed but not stuck-at test | 0/18 |
| All fail | 1/3040 |
| Short power fail | 10/17 |

The efficiencies of all test methods and that of the graphical IDDQ evaluation method 10 are shown in Table 5. It is shown that the method of the present invention identifies more defective chips than other methods. The method of the present invention also has lower yield loss, because of the 400 chips that first were declared bad but later turned out not be good under the SEMATECH methods.

TABLE 5

Comparison of efficiencies of test methods with IDDQ threshold of 450 μA.

| Kind of test method | % Defective chips detected |
|---|---|
| Functional Test | 61.5% |
| Stuck-at Test | 83.4% |
| Delay Test | 82.2% |
| Single Threshold IDDQ Test | 93.5% |
| Graphical IDDQ Test of method 10 | 96.1% |

The results show that IDDQ testing is still useful for deep submicron technology, because this method does not relate results of IDDQ testing to absolute current measurements, but rather to the shape of the series of measurements.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

What is claimed is:

1. A method for detecting defects within an integrated circuit comprising the steps of:
   making IDDQ current measurements on an integrated circuit during chip characterization;
   selecting one or more parameters of a classifier by graphical evaluation of said IDDQ current measurements; and
   applying said one or more parameters of said classifier to an integrated circuit under test to detect if said integrated circuit under test is good or defective.

2. The method of claim 1 wherein said IDDQ current measurements are obtained by applying a set of current vectors to said integrated circuit during chip characterization.

3. The method of claim 2 wherein said graphical evaluation of said IDDQ measurements comprises the steps of:
   forming a band diagram of said IDDQ current measurements and said set of current vectors;
   determining one or more features of said band diagram;
   determining optimization of said one or more features of said band diagram; and
   selecting said one or more parameters of said classifier from the optimization of said one or more of features of said band diagram.

4. The method of claim 3 wherein said one or more features of said band diagram are selected from a number of bands, a width of a band, a separation between adjacent bands, a band width ratio between a first band and a second band, a band separation ratio between a first pair of adjacent bands and a second pair of adjacent bands, a maximum IDDQ value, a minimum IDDQ value, a mean of each band, a standard deviation of each band, one or more extreme points of a band, a noise level of the IDDQ current measurements, a slope of a band, a variation in width of a band, a lack of activity of IDDQ current measurements and glitches in the IDDQ current measurements.

5. The method of claim 3 wherein said determined features of said band diagram are the number of bands, the width of a band, the separation between adjacent bands and the glitch in the IDDQ current measurements.

6. The method of claim 4 wherein said one or more parameters of said classifier are selected from the group consisting of a number of bands for a good integrated circuit, a width of a band for a good integrated circuit, a separation between adjacent bands for a good integrated circuit, a band width ratio between a first band and a second band for a good integrated circuit, a band separation ratio between a first pair of adjacent bands and a second pair of adjacent bands for a good integrated circuit, a maximum IDDQ value for an integrated circuit, a minimum IDDQ value for an integrated circuit, a mean of each band for an integrated circuit, a standard deviation of each band for an integrated circuit, a noise level of IDDQ current measurements, a slope of a band for an integrated circuit, a variation in width of a band for an integrated circuit, a lack of activity of IDDQ current measurements and glitches in the IDDQ current measurements.

7. The method of claim 6 wherein said selected parameters of said classifier are the number of bands for a good integrated circuit, the width of a band for a good integrated circuit, the separation between adjacent bands for a good integrated circuit and the glitch in the IDDQ current measurements.

8. The method of claim 6 wherein said feature of said band diagram comprises said number of bands and said step of determining optimization of said one or more features comprises:
   plotting a three-dimensional graph of yield and test escape versus said number of bands; and
   performing optimization on said three-dimensional graph to provide an optimal number of bands having an optimal highest yield and optimal lowest test escape wherein said optimal number of bands determines said parameter of said classifier of said number of bands for a good integrated circuit.

9. The method of claim 6 wherein said one or more features of said band diagram comprises said width of a band and said step of determining optimization of said one or more features comprises:
   plotting a three-dimensional graph of yield and test escape versus said width of a band; and
   performing optimization on said three-dimensional graph to provide an optimal width of a band having an optimal highest yield and optimal lowest test escape wherein said optimal width of a band determines said parameter of said classifier of said width of a band for a good integrated circuit.

10. The method of claim 6 wherein said one or more features comprises said band separation between adjacent bands and said step of determining optimization of said one or more features comprises:
   plotting a three-dimensional graph of yield and test escape versus said separation between adjacent bands; and
   performing optimization on said three-dimensional graph to provide an optimal separation between adjacent bands having an optimal highest yield and optimal lowest test escape wherein said separation between adjacent bands determines said parameter of said classifier of said separation between adjacent bands.

11. The method of claim 6 wherein said one or more features of said band diagram comprises said band width ratio and said step of determining optimization of said one or more features comprises:
   plotting a three-dimensional graph of yield and test escape versus said band width ratio; and
   performing optimization on said three-dimensional graph to provide an optimal band width ratio having an optimal highest yield and optimal lowest test escape wherein said optimal band width ratio determines said parameter of said classifier of said band width ratio for a good integrated circuit.

12. The method of claim 6 wherein said one or more features of said band diagram comprises said band separation ratio and said step of determining optimization of said one or more features comprises:
   plotting a three-dimensional graph of yield and test escape versus said band separation ratio; and
   performing optimization on said three-dimensional graph to provide an optimal band separation ratio having an optimal highest yield and optimal lowest test escape wherein said optimal band separation ratio determines said parameter of said classifier of said band separation ratio for a good integrated circuit.

13. The method of claim 6 wherein said one or more features of said band diagram comprises said noise level of the IDDQ current measurements, said noise level being determined by determining if said one or more extreme points are a certain number of said standard deviation of the band away from said mean of the band and said step of determining optimization of said one or more features comprises:
   plotting a three-dimensional graph of yield and test escape versus said noise level; and
   performing optimization on said three-dimensional graph to provide an optimal noise level having an optimal highest yield and optimal lowest test escape wherein said optimal noise level determines said parameter of said classifier of said noise level for a good integrated circuit.

14. The method of claim 6 wherein said one or more features of said band diagram comprises said slope of a band and said step of determining optimization of said one or more features comprises:
   plotting a three-dimensional graph of yield and test escape versus said slope of a band; and
   performing optimization on said three-dimensional graph to provide an optimal slope of a band having an optimal highest yield and optimal lowest test escape wherein said optimal slope of a band determines said parameter of said classifier of said slope of a band for a good integrated circuit.

15. The method of claim 6 wherein said one or more features of said band diagram comprises said variation in width of a band and said step of determining optimization of said one or more features comprises:
   plotting a three-dimensional graph of yield and test escape versus said variation in width of a band; and
   performing optimization on said three-dimensional graph to provide an optimal variation in width of a band having an optimal highest yield and optimal lowest test escape wherein said optimal variation in width of a band determines said parameter of said classifier of said variation in width of a band for a good integrated circuit.

16. The method of claim 3 wherein said step of forming a band diagram comprises the steps of:
   sorting said IDDQ current measurements by value;
   calculating a distance adjacent said IDDQ current measurements;
   comparing said distance to a criteria of a noise ratio; and
   establishing a band if said distance of adjacent IDDQ current measurements is greater than said criteria.

17. The method of claim 9 wherein said criteria of a noise ratio is determined by the steps of:
   plotting a three-dimensional graph of yield and test escapes versus said noise ratio; and
   performing optimization on said three-dimensional graph to provide an optimal value of said noise ratio.

18. A method of claim 3 wherein said glitches in said IDDQ current measurements are determined by the steps of:
   sorting a distance of said IDDQ current measurements; and
   determining if said maximum IDDQ current measurement differs from an adjacent IDDQ current measurement by more than a predetermined number.

19. The method of claim 1 further comprising after the step of selecting one or more parameters of a classifier, the step of:
   applying said classifier to eliminate redundant vectors from said set of current vectors to form a set of test current vectors.

20. The method of claim 19 wherein said step of applying said one or more parameters of said classifier includes applying said set of test current vectors to determine test IDDQ current measurements for said integrated circuit under test and applying said classifier to said test IDDQ current measurements.

21. The method of claim 1 wherein said one or more parameters of a classifier are selected based on fabrication or design specifications for said integrated circuit.

22. The method of claim 1 wherein said one or more parameters of said classifier are selected from the group consisting of a number of bands for an integrated circuit, a width of a band for an integrated circuit, a separation between adjacent bands for an integrated circuit, a band width ratio between a first band and a second band for an integrated circuit, a band separation ratio between a first pair of adjacent bands and a second pair of adjacent bands for an integrated circuit, a maximum IDDQ value for an integrated circuit, a minimum IDDQ value for an integrated circuit, a mean of each band for a good integrated circuit, a standard deviation of each band for an integrated circuit, a noise level of IDDQ current measurements, a slope of a band for a good integrated circuit, a variation in width of a band for a good integrated circuit, a lack of activity of IDDQ current measurements and glitches in the IDDQ current measurements.

23. A system for detecting defects within an integrated circuit comprising:
   means for making IDDQ current measurements on an integrated circuit during chip characterization;
   means for selecting one or more parameters of a classifier by graphical evaluation of said IDDQ current measurements; and
   means for applying said one or more parameters of said classifier to an integrated circuit under test to detect if said integrated circuit under test is good or defective.

24. The system of claim 23 wherein said IDDQ current measurements are obtained by applying a set of current vectors to said integrated circuit during chip characterization.

25. The system of claim 24 wherein said graphical evaluation of said IDDQ measurements comprises:
   means for forming a band diagram of said IDDQ current measurements and said set of current vectors;
   means for determining one or more features of said band diagram;
   means for determining optimization of said one or more features of said band diagram; and
   means for selecting said one or more parameters of said classifier from the optimization of said one or more of features of said band diagram.

26. The system of claim 25 wherein said one or more features of said band diagram are selected from a number of bands, a width of a band, a separation between adjacent bands, a band width ratio between a first band and a second band, a band separation ratio between a first pair of adjacent bands and a second pair of adjacent bands, a maximum IDDQ value, a minimum IDDQ value, a mean of each band, a standard deviation of each band, one or more extreme points of said band, a noise level of the IDDQ current measurements, a slope of a band, a variation in width of a band, a lack of activity of IDDQ current measurements and glitches in the IDDQ current measurements.

27. The system of claim 26 wherein said determined features of said band diagram are the number of bands, the width of a band, the separation between adjacent bands and the glitch in the IDDQ current measurements.

28. The system of claim 26 wherein said one or more parameters of said classifier are selected from the group consisting of a number of bands for a good integrated circuit, a width of a band for a good integrated circuit, a separation between adjacent bands for a good integrated circuit, a band width ratio between a first band and a second band for a good integrated circuit, a band separation ratio between a first pair of adjacent bands and a second pair of adjacent bands for a good integrated circuit, a maximum IDDQ value for an integrated circuit, a minimum IDDQ value for an integrated circuit, a mean of each band for an integrated circuit, a standard deviation of each band for an integrated circuit, a noise level of IDDQ current measurements, a slope of a band for a good integrated circuit, a variation in width of a band for a good integrated circuit, a lack of activity of IDDQ current measurements and glitches in the IDDQ current measurements.

29. The system of claim 28 wherein said selected parameters of said classifier are the number of bands for a good integrated circuit, the width of a band for a good integrated circuit, the separation between adjacent bands for a good integrated circuit and the glitch in the IDDQ current measurements.

30. The system of claim 28 wherein said feature of said band diagram comprises said number of bands and said means for determining optimization of said one or more features comprises:
   means for plotting a three-dimensional graph of yield and test escape versus said number of bands; and
   means for performing optimization on said three-dimensional graph to provide an optimal number of bands having an optimal highest yield and optimal lowest test escape wherein said optimal number of bands determines said parameter of said classifier of said number of bands for a good integrated circuit.

31. The system of claim 28 wherein said one or more features of said band diagram comprises said width of a band and means for determining optimization of said one or more features comprises:
   means for plotting a three-dimensional graph of yield and test escape versus said width of a band; and
   means for performing optimization on said three-dimensional graph to provide an optimal width of a band having an optimal highest yield and optimal lowest test escape wherein said optimal width of a band determines said parameter of said classifier of said width of a band for a good integrated circuit.

32. The system of claim 28 wherein said one or more features comprises said separation between adjacent bands and means for determining optimization of said one or more features comprises:
  means for plotting a three-dimensional graph of yield and test escape versus said band separation between adjacent bands; and
  means for performing optimization on said three-dimensional graph to provide an optimal separation between adjacent bands having an optimal highest yield and optimal lowest test escape wherein said optimal separation between adjacent bands determines said parameter of said classifier of said separation between adjacent bands.

33. The system of claim 28 wherein said one or more features of said band diagram comprises said band width ratio and means for determining optimization of said one or more features comprises:
  means for plotting a three-dimensional graph of yield and test escape versus said band width ratio; and
  means for performing optimization on said three-dimensional graph to provide an optimal band width ratio having an optimal highest yield and optimal lowest test escape wherein said optimal band width ratio determines said parameter of said classifier of said band width ratio for a good integrated circuit.

34. The system of claim 28 wherein said one or more features of said band diagram comprises said band separation ratio and means for determining optimization of said one or more features comprises:
  means for plotting a three-dimensional graph of yield and test escape versus said band separation ratio; and
  means for performing optimization on said three-dimensional graph to provide an optimal band separation ratio having an optimal highest yield and optimal lowest test escape wherein said optimal band separation ratio determines said parameter of said classifier of said band separation ratio for a good integrated circuit.

35. The system of claim 28 wherein said one or more features of said band diagram comprises said noise level of the IDDQ current measurements, said noise level being determined by determining if said one or more extreme points are a certain number of said standard deviation of the band away from said mean of the band and determining optimization of said one or more features comprises:
  means for plotting a three-dimensional graph of yield and test escape versus said noise level; and
  means for performing optimization on said three-dimensional graph to provide an optimal noise level having an optimal highest yield and optimal lowest test escape wherein said optimal noise level determines said parameter of said classifier of said noise level for a good integrated circuit.

36. The system of claim 28 wherein said one or more features of said band diagram comprises said slope of a band and means for determining optimization of said one or more features comprises:
  means for plotting a three-dimensional graph of yield and test escape versus said slope of a band; and
  means for performing optimization on said three-dimensional graph to provide an optimal slope of a band having an optimal highest yield and optimal lowest test escape wherein said optimal slope of a band determines said parameter of said classifier of said slope of a band for a good integrated circuit.

37. The system of claim 28 wherein said one or more features of said band diagram comprises said variation in width of a band and means for determining optimization of said one or more features comprises:
  means for plotting a three-dimensional graph of yield and test escape versus said variation in width of a band; and
  means for performing optimization on said three-dimensional graph to provide an optimal variation in width of a band having an optimal highest yield and optimal lowest test escape wherein said optimal variation in width of a band determines said parameter of said classifier of said variation in width of a band for a good integrated circuit.

38. The system of claim 26 wherein said means for forming a band diagram comprises:
  means for sorting said IDDQ current measurements by value;
  means for calculating a distance adjacent to said IDDQ current measurements;
  means for comparing said distance to a criteria of a noise ratio; and
  means for establishing a band if said distance of adjacent IDDQ current measurements is greater than said criteria.

39. The system of claim 38 wherein said criteria of a noise ratio is determined by:
  means for plotting a three-dimensional graph of yield and test escapes versus said noise ratio; and
  means for performing optimization on said three-dimensional graph to provide an optimal value of said noise ratio.

40. A system of claim 26 wherein said glitches in the IDDQ current measurements are determined by:
  means for sorting a distance of said IDDQ current measurements; and
  means for determining if said maximum IDDQ current measurement differs from an adjacent IDDQ current measurement by more than a predetermined number.

41. The system of claim 23 further comprising:
  means for applying said classifier to eliminate redundant vectors from said set of current vectors to form a set of test current vectors.

42. The system of claim 41 wherein said means for applying said one or more parameters of said classifier includes applying said set of test current vectors to determine test IDDQ current measurements for said integrated circuit under test and applying said classifier to said test IDDQ current measurements.

43. The system of claim 23 wherein said one or more parameters of a classifier are selected based on fabrication or design specifications for said integrated circuit.

44. The system of claim 23 wherein said one or more parameters of said classifier are selected from the group consisting of a number of bands for a good integrated circuit, a width of a band for a good integrated circuit, a separation between adjacent bands for a good integrated circuit, a band width ratio between a first band and a second band for a good integrated circuit, a band separation ratio between a first pair of adjacent bands and a second pair of adjacent bands for a good integrated circuit, a maximum IDDQ value for an integrated circuit, a minimum IDDQ value for an integrated circuit, a mean of each band for an integrated circuit, a standard deviation of each band for an integrated circuit, a noise level of IDDQ current measurements, a slope of a band for a good integrated circuit, a variation in width of a band for a good integrated circuit, a lack of activity of IDDQ current measurements and glitches in the IDDQ current measurements.

* * * * *